United States Patent [19]

Ishitani

[11] 3,977,017

[45] Aug. 24, 1976

[54] MULTI-CHANNEL JUNCTION GATED FIELD EFFECT TRANSISTOR AND METHOD OF MAKING SAME

[75] Inventor: Akiyasu Ishitani, Atsugi, Japan

[73] Assignee: Sony Corporation, Tokyo, Japan

[22] Filed: Jan. 20, 1975

[21] Appl. No.: 542,377

Related U.S. Application Data

[63] Continuation-in-part of Ser. No. 384,234, July 31, 1973, abandoned.

[30] Foreign Application Priority Data

Apr. 25, 1973   Japan.............................. 48-47445
Oct. 13, 1973   Japan............................ 48-115120

[52] U.S. Cl................................... 357/22; 357/20; 357/36; 357/55
[51] Int. Cl.²........................................ H01L 29/80
[58] Field of Search.................. 357/20, 22, 36, 49, 357/55

[56] References Cited

UNITED STATES PATENTS

| | | | |
|---|---|---|---|
| 3,767,982 | 10/1973 | Teszner et al. | 357/22 |
| 3,814,995 | 6/1974 | Teszner | 357/22 |
| 3,841,917 | 10/1974 | Shannon | 357/22 |
| 3,855,608 | 12/1974 | George et al. | 357/22 |

OTHER PUBLICATIONS

A. Morgan et al., "A Proposed Vertical Channel Variable Resistance Fet," Proc. IEEE, vol. 59, No. 5, May 1971, pp. 805–807.

*Primary Examiner*—Michael J. Lynch
*Assistant Examiner*—Joseph E. Clawson, Jr.
*Attorney, Agent, or Firm*—Hill, Gross, Simpson, Van Santen, Steadman, Chiara & Simpson

[57] ABSTRACT

A multi-channel junction gated field effect transistor which gives good triode characteristics is formed on a substrate of semiconductor material of relatively low impurity concentration of a first conductivity type. A mosaic shape semiconductor gate region of the opposite conductivity type is formed in the substrate below one major surface thereof, the mosaic shape of the gate region forming a plurality of windows filled with portions of the substrate which thus provide channels leading to the main body of the substrate, the main body of the substrate providing the drain region for the transistor. A corresponding relatively thick mosaic shape insulating layer overlies the mosaic shape gate region has a plurality of windows, which windows are smaller than the windows of the gate region and of the same configuration, the windows of the insulating layer being aligned with the windows of the gate region. The source consists of two regions, one which is heavily doped with impurity of the first conductivity type and the second which has less doping than that of the first source region but of greater doping than the drain region and the channel regions. The first source region is completely within the windows of the insulating layer, while the second source region is partially within such windows and extends down as a tongue partially into the channel. Electrodes are provided for the source, gate and drain regions.

The substrate is preferably N-type silicon having a doping level of $10^{14}$ to $10^{15}$ atoms/cm$^3$. The first source region preferably has a doping higher than $5 \times 10^{19}$, while the second source region with its tongues has a doping level between $10^{16}$ and $10^{18}$ atoms/cm$^3$. If the doping level of the second source region is $10^{18}$ atoms/cm$^3$, it is possible to have the substrate doped to $10^{16}$ atoms/cm$^3$.

7 Claims, 14 Drawing Figures

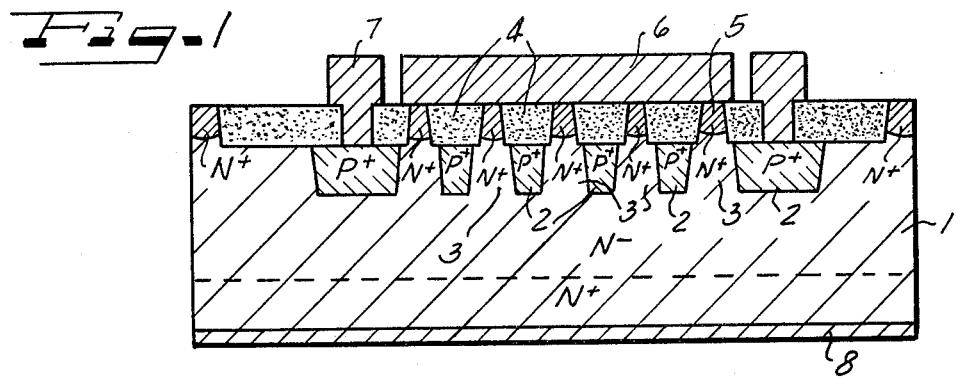
Fig-1
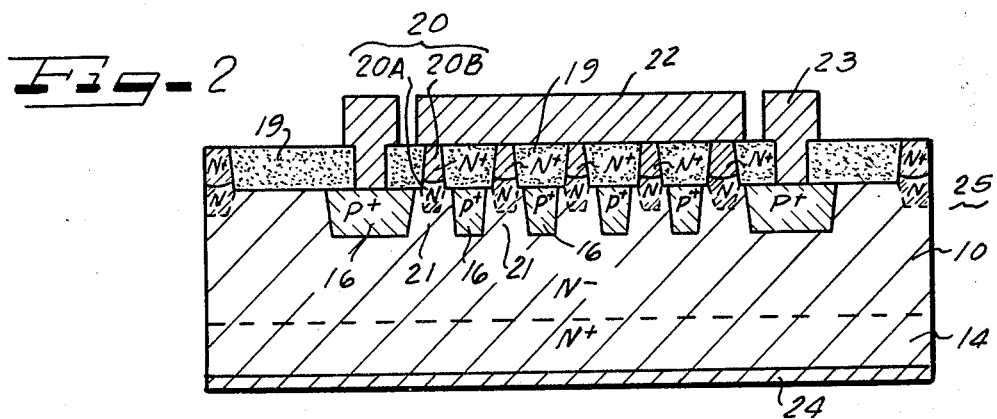
Fig-2
Fig-3
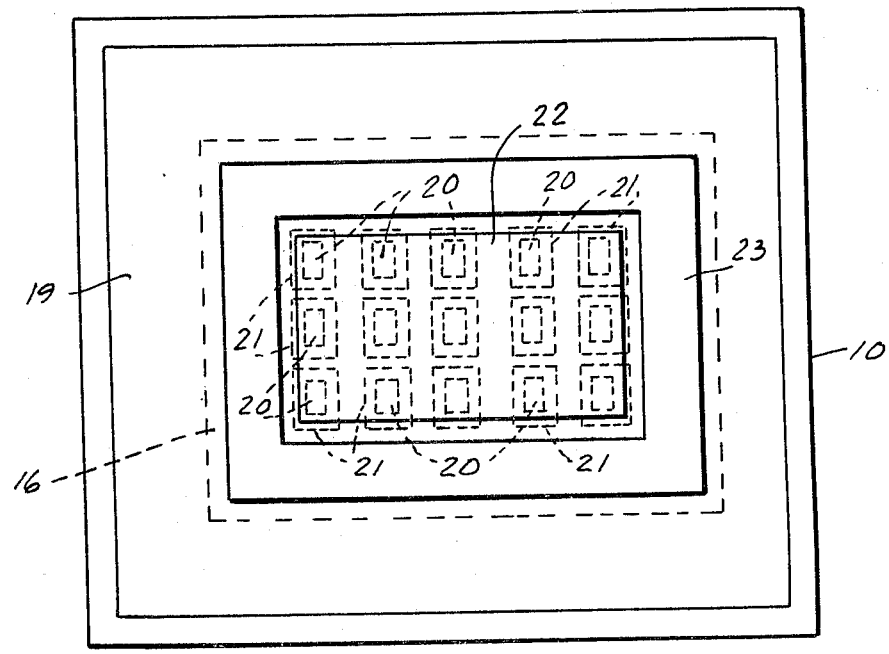

3,977,017

MULTI-CHANNEL JUNCTION GATED FIELD EFFECT TRANSISTOR AND METHOD OF MAKING SAME

CROSS REFERENCE TO RELATED APPLICATION

In applicant's co-pending application, Ser. No. 384,234, filed July 31, 1973 and now abandoned, and assigned to the same assignee as the present invention, an improved form of multi-channel junction gated vertical field effect transistor is described and claimed. The present application is a continuation-in-part of this application.

BACKGROUND OF THE INVENTION

The present invention relates to multi-channel junction gated field effect transistors and particularly to those in which the current flowing longitudinally therethrough is controlled laterally. Such transistors are sometimes referred to as vertical junction gated field effect transistors. Transistors of this general category are known in the art and are described in various prior art patents. See, for example, such patents as Wegener No. 3,025,438, Teszner No. 3,274,461, Teszner No. 3,497,777 and Teszner No. 3,767,982.

An advantage of a multi-junction vertical field effect transistor is that it can carry high current and therefore high power. A further advantage is that triode characteristics are easily obtained. This is because the ratio of the channel length to the channel width may be kept quite small.

SUMMARY OF THE INVENTION

It is an object of the present invention to provide a vertical junction gated field effect transistor having improved characteristics. This is provided by having the source region formed of semiconductor material doped at different levels of impurity concentration, both source regions being higher in impurity concentration than the channel region and the drain region. The source region, which is most remote from the channel, has the highest impurity concentration level, while the other source region, which lies between the first source region and the channel, is of a lower impurity concentration level and extends in a tongue into each channel.

More specifically, a multi-channel junction gated field effect transistor which gives good triode characteristics is formed on a substrate of semiconductor material of relatively low impurity concentration of a first conductivity type. A mosaic shape semiconductor gate region of the opposite conductivity type is formed in the substrate below one major surface thereof, the mosaic shape of the gate region forming a plurality of windows filled with portions of the substrate which thus provide channels leading to the main body of the substrate, the main body of the substrate providing the drain region for the transistor. A corresponding relatively thick mosaic shape insulating layer overlies the mosaic shape gate region has a plurality of windows, which windows are smaller than the windows of the gate region and of the same configuration, the windows of the insulating layer being aligned with the windows of the gate region. The source consists of two regions, one which is heavily doped with impurity of the first conductivity type and the second which has less doping than that of the first source region but of greater doping than the drain region and the channel regions. The first source region is completely with the windows of the gate region while the second source region is partially with such windows and extends down as a tongue partially into the channel. Electrodes are provided for the source, gate and drain regions.

The substrate is preferably N-type silicon having a doping level of $10^{14}$ to $10^{15}$ atoms/cm$^3$. The first source region preferably has a doping higher than $5 \times 10^{19}$ while the second source region with its tongues has a doping level between $10^{16}$ and $10^{18}$ atoms/cm$^3$. If the doping level of the second source region is $10^{18}$ atoms/cm$^3$, it is possible to have the substrate doped to $10^{16}$ atoms/cm$^3$.

A particular object of the present invention is to provide a junction gated field effect transistor having triode like characteristics, notwithstanding decreasing the breakdown voltage between the gate and the source.

It is still another object of the present invention to provide a vertical type junction gated field effect transistor having good ohmic characteristics in the source contact thereof.

BRIEF DESCRIPTION OF THE DRAWINGS

FIG. 1 shows a cross sectional view of a multi-channel junction gated field effect transistor of the type disclosed in my copending patent application, Ser. No. 384,234;

FIG. 2 shows a cross sectional view of a preferred embodiment of the present invention;

FIG. 3 is a plan view of the embodiment shown in FIG. 2;

DESCRIPTION OF THE PREFERRED EMBODIMENTS

Figure 4:
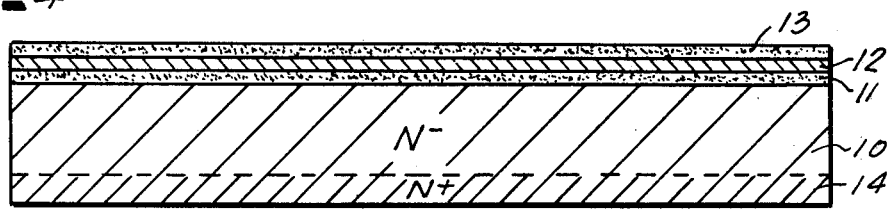
FIGS. 4 to 13 diagrammatically show steps in the fabrication of the preferred embodiment of the invention shown in FIGS. 2 and 3.

Before turning to a description of the preferred embodiments of the present invention, reference is made to the field effect transistor disclosed in my co-pending application, Ser. No. 384,234, as exemplified in FIG. 1. A semiconductor substrate is provided of N$^-$ and N$^+$ type silicon, the main body of which provides the drain region for the transistor. A semiconductor gate region 2 of the P+ type is diffused and formed in a mesh-like pattern in the upper surface of the substrate which thus provides a mosaic shape for the gate region having a plurality of windows filled with portions of the substrate to provide a plurality of channels 3. A relatively thick insulating layer 4 covers the upper surface of the substrate including the gate region 2. The insulating layer is formed as a mosaic having windows aligned with the windows of the gate region but of smaller cross sectional area. A plurality of highly doped source regions 5 are formed in the windows of the insulating layer 4 and in contact with the upper surface of the channel regions, respectively. A source electrode 6, a gate electrode 7 and a drain electrode 8 are provided as shown. The highly doped N+ region in the lower part of the substrate 1 is for the purpose of making a good ohmic contact between electrode 8 and the main body of N$^-$ semiconductor material, which forms the drain of the transistor.

It has been found that it is difficult to further decrease the source resistance without decreasing the breakdown voltage between the gate region 2 and the source region 5. In order to prevent these two characteristics from decreasing, the impurity concentration of the source region 5 must be low, but this causes a bad ohmic contact for the source regions.

FIG. 2 shows a preferred embodiment of the present invention, in which a vertical type junction gated field effect transistor has a structure quite similar to that shown in FIG. 1, but differs therefrom in the nature and structure of the source regions and the channels.

The junction gated field effect transistor 25 shown in FIG. 2 shows a substrate which includes an N⁻ semiconductor region of silicon 10 formed on an N+ region 14. A P+ type gate region 16 is diffused into the upper surface of the substrate 10 beneath an insulating layer 19, which is provided with a mesh like pattern to form a mosaic having windows filled with portions of the N⁻ substrate 10. The channel region 21 and the upper portion of the substrate 10 form a PN rectifying junction with the P+ type gate region 16. A relatively thick insulating layer 19, for example, silicon dioxide ($SiO_2$), is buried selectively in the silicon substrate covering the mesh like gate region 16.

A plurality of source regions 20B of highly doped N-type silicon extend down into the windows of the insulating layer 19 from the outer surface thereof to a point slightly short of the bottom of the windows in the insulating layer. A plurality of auxiliary source regions 20A of intermediately doped N-type silicon are formed in the remaining lower portion of the windows and include tongues which extend down into the upper ends of the channels 21.

The nature of the mosaic pattern of the insulating layer 19 and of the gate region 16 are readily recognized from an inspection of FIG. 3, which is a plan view of the embodiment shown in FIG. 2.

The preferred doping concentrations of the principal regions are as follows. The N⁻ region 10, which also includes the channel regions 21 are preferably doped to the level of $10^{14}$ to $10^{15}$ atoms/cm³. The doping concentration level of the N-type source regions 20A is preferably $10^{16}$ to $10^{18}$ atoms/cm³. The doping concentration level of the N+ source regions 20B is preferably higher than $5 \times 10^{19}$ atoms/cm³. When the doping concentration level of the N-type region 20A is at the upper end of its range, namely $10^{18}$ atoms/cm³, then it is possible to have the N⁻ region 10 and the channel regions 21 doped as high as $10^{16}$ atoms/cm³. The above structure has been found to give good diode characteristics.

As shown, an N-type silicon substrate 10 is prepared, which is lightly doped with phosphorus (P) as an impurity. The impurity concentration thereof is about $10^{14}$ to $10^{15}$ atoms/cm³. The lightly doped region 10 becomes ultimately a drain region of the field effect transistor. A highly doped N-type region 14 is diffused on the bottom surface of the substrate 10. This highly doped region 14 has a sufficiently high impurity concentration as to afford a good ohmic contact for the drain electrode which will be deposited thereon in a later step. Preferably, this impurity concentration is higher than $5 \times 10^{19}$ atoms/cm³. Various methods may be employed for forming the N+ layer 14 on the substrate, for example, an N-type epitaxial layer 10 may be formed on an N+ body or substrate 14.

A source electrode 22 is formed over the upper surface of the insulating layer 19 in contact with the upper ends of the source regions 20B. A gate electrode 23 is provided, which extends through the insulating layer into contact with the gate region 16. A drain electrode 24 is provided on the under surface of the N+ region 14, this N+ region being provided to afford good ohmic contact between the electrode 24 and the main body 10 which forms the drain region.

The afore-described field effect transistor may be easily fabricated as is diagrammatically illustrated in FIGS. 4 to 13.

As shown in FIG. 4, a first insulating layer such, for example, as silicon dioxide ($SiO_2$), a second insulating layer, for example, silicon nitride ($Si_3N_4$), and a third insulating layer, for example, silicon dioxide ($SiO_2$) are deposited in order on the top surface of the N-type substrate 10. The first layer 11 is selected so as to have a good physical matching with the silicon substrate 10. The second layer 12 is selected so that the chemical etching characteristic is different from the first layer 11 and has a resistance characteristic against thermal oxidation. Silicon nitride ($Si_3N_4$) is a well-known material for use as an oxidation mask. The third layer 13 is selected so that it has a good etching mask characteristic for the chemical etching process of the second insulating layer. It is well known that a photo resist is not sufficient as an etching mask for the nitride layer because of the hardness of the nitride. For this reason, $SiO_2$ is used as the third layer 13.

FIG. 4 shows the second step where three insulating layers 11, 12 and 13 are etched selectively with a mesh like pattern. The second layer 12 is etched with the mask of the third layer 13. The first layer 11 is etched with the mask of the second layer 12. A self-alignment is achieved in the above steps. A plurality of insulating layers remain.

A P-type gate region 16 is formed by selective diffusion through the windows of the three insulating layers 11, 12 and 13. The gate region 16 is formed with a mesh like pattern corresponding with the pattern of the insulating layers.

Figure 5:
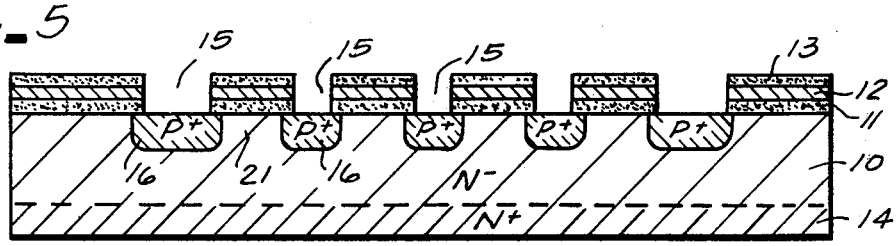

FIG. 5, taken in conjunction with FIG. 3, shows that the P-type gate region has a mesh like pattern. The impurity concentration of the P-type gate region is relatively high and preferably approximately $10^{18}$ to $10^{20}$ atoms/cm³. The selective diffusion of the gate region defines a plurality of vertical channels surrounded by a PN rectifying junction.

Figure 6:
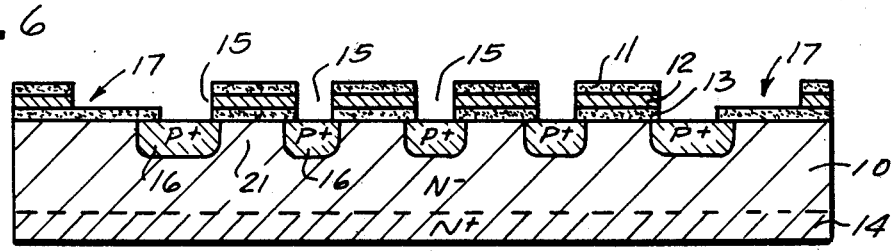
Figure 7:
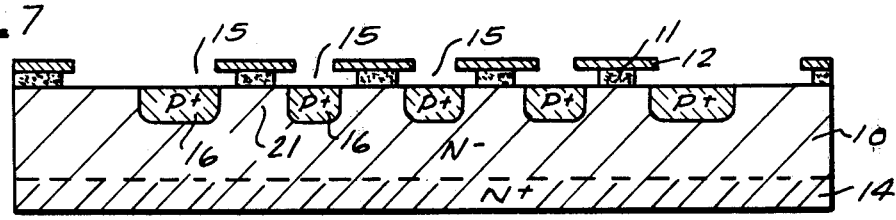

In the third step, shown in FIG. 6, an outer portion 17 of the second and third insulating layers is further etched, but the inner portion remains. The third silicon dioxide layer 13 is etched and removed without any mask and at the same time, the first silicon dioxide layer 11 is selectively etched with the nitride mask 12. By controlling the etching time, a portion of the first silicon dioxide layer 11 under the nitride mask 12 is also etched a little, as shown in FIG. 7. The end portion of the PN rectifying junction between the P+ type gate region and the N⁻ substrate is exposed by etching. Parts of the channel adjacent the PN junction are also exposed.

Figure 8:
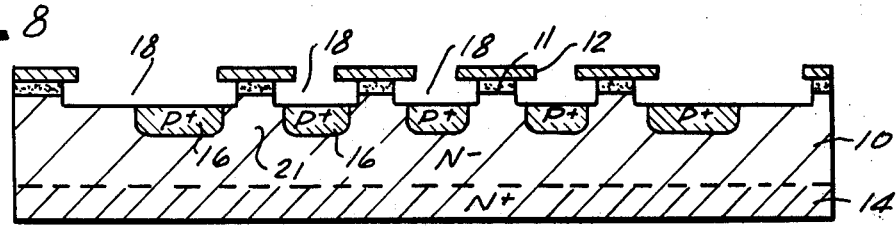

The silicon substrate, including the main body portion 10 and the P+ type gate regions 16 is selectively etched from the top surface with the etching mask of the first silicon dioxide layer 11, as shown in FIG. 8. By the etching, a groove in the silicon substrate is formed with a mesh like pattern. The depth of the groove is carefully controlled.

Figure 9:
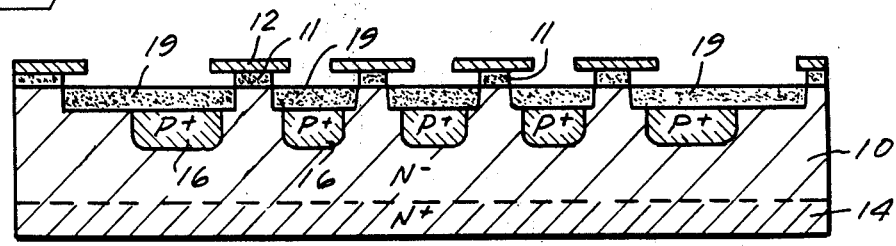

FIG. 9 shows the next step where the exposed surface of the groove is oxidized by thermal oxidation. The second layer 12 of silicon nitride acts as an oxidation mask when the silicon substrate is exposed in steam having a temperature of about 900° to 1100°C. The bottom surface should be covered with another mask. The thermally oxidized layer 19 of thick silicon dioxide is grown in the groove, and the surface of the silicon dioxide layer 19 becomes almost flat and on a level with the original silicon surface because of the expansibility of the thermal oxide. The thickness of the thick oxide layer 19 is 1 to 2 microns.

Figure 10:
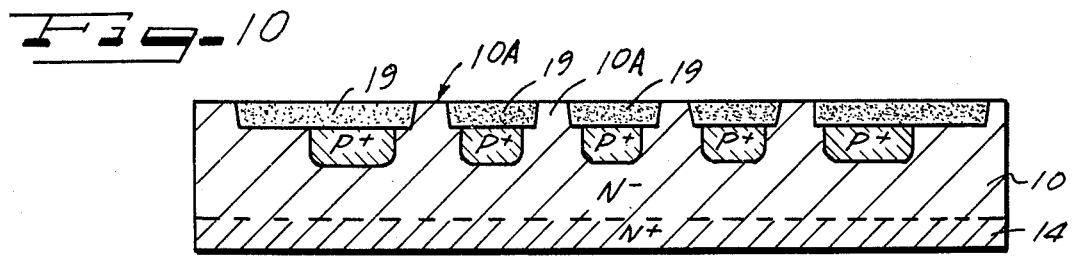

The insulating layers 11 and 12 are removed as shown in FIG. 10, but the thick oxide layer 19 remains. A plurality of mesa portions 10A of N-type silicon are exposed. These mesa portions 10A are surrounded by the thick oxide layer 19 of the mesh like pattern.

Figure 11:
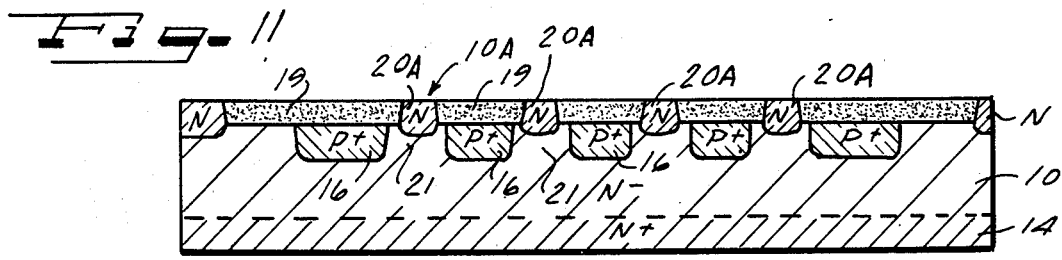

The first source regions 20A are diffused from the top surfaces 10A of a plurality of mesas toward the channel portions 21, as shown in FIG. 11. The impurity concentration of the first source regions 20A is preferably $10^{17}$ atoms/cm$^3$, but in any event, between $10^{16}$ to $10^{18}$ atoms/cm$^3$, depending upon the breakdown voltage characteristics between the source and the gate. It is preferable that the bottom ends of the first source regions 28 extend as tongues into the channel regions 21. Because of this arrangement of the first source regions 20A, the channel length is very short and causes a good triode like characteristic. The bottom ends of the first source regions 20A are preferably very close or adjacent to the gate regions 16. An N$^-$-N junction between the N$^-$ channel 21 and the first source regions 20A ends at the surface of the groove and faces the thick oxide layer 19. The gate rectifying junction also ends and terminates at the surface of the groove of silicon and faces the thick oxide layer 19.

The first source regions 20A may be formed not only by normal diffusion, but also by ion implantation. The ion implantation method, which is well known, is the process of introducing impurities into semiconductor material.

Figure 12:
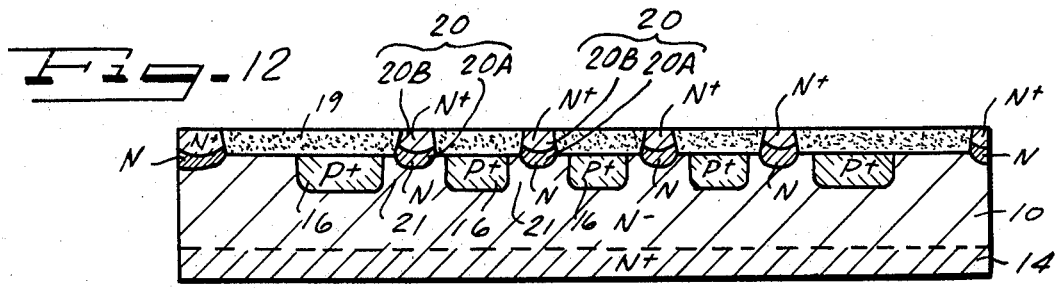

FIG. 12 shows a second diffusion step to form the second source regions 20B on the top surface 10A of each mesa. The thick oxide layer 19 acts as a diffusion mask for the first N diffusion and also the second N+ diffusion process. The second source regions 20B have a higher impurity concentration than the first source regions 20A, for example, higher than $5 \times 10^{19}$ atoms/cm$^3$, is preferable for good ohmic characteristics. The end of the N-N+ junction between the first source region 20A and the second source region 20B faces and terminates at the faces of the thick oxide layer 19. The depth of the second source regions 20B is such that they terminate short of the bottom portions of the windows in the insulating layer 19.

Figure 13:
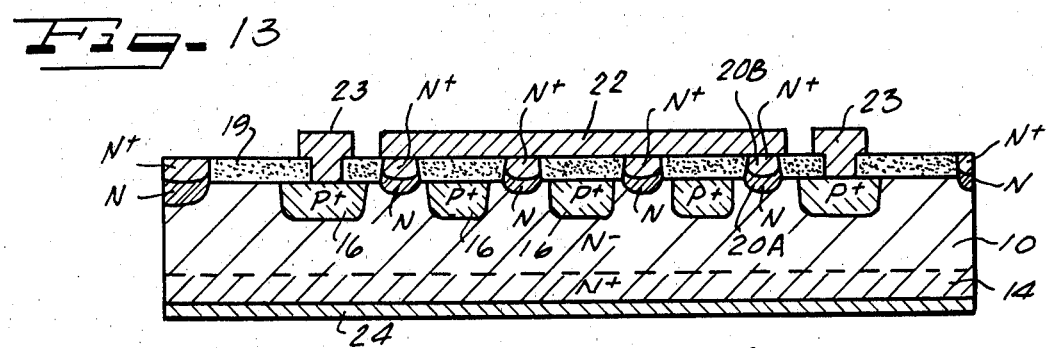

As shown in FIG. 13, a conductive material such as aluminum (Al) is deposited on the two surfaces of the device. After selectively etching of the aluminum, three electrodes are formed; namely, a source electrode 22, a gate electrode 23 and a drain electrode 24. The source electrode 22 covers and touches all of the second source regions 20B formed on the mesas of the semiconductor material. It also covers and touches the top surface of the thick oxide layer 19.

A highly doped region may be formed at the periphery of the top surface to be used as a drain electrode instead of the bottom electrode 24.

The conductive material for the electrodes is not limited to metal, but may be, for example, highly doped polycrystalline silicon. Such a highly doped polycrystalline silicon may be deposited by a chemical vapor deposition method, for example, covering the thick oxide layer 19, together with the top surface of the mesas.

Figure 14:
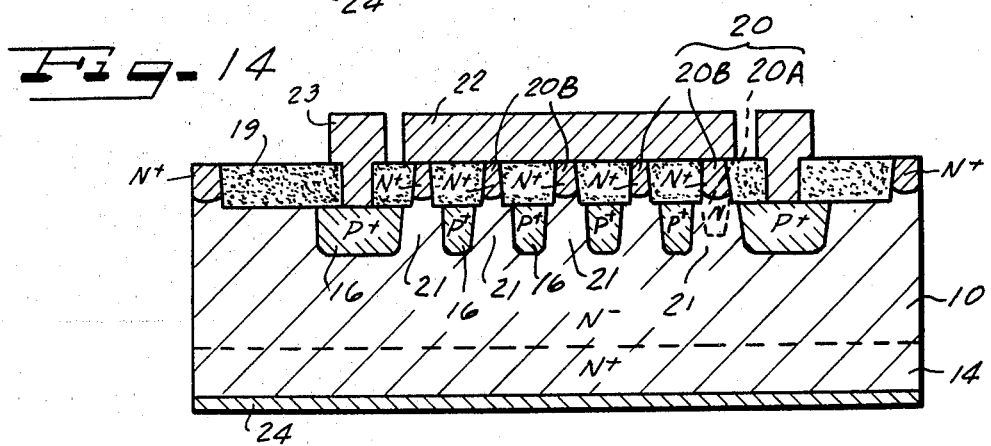
FIG. 14 is a cross sectional view showing another embodiment of the present invention.

A second embodiment of the present invention is shown in FIG. 14. The pinch-off voltage $V_P$ becomes large when the first source region 20A exists. The deeper the first source region is, the higher the $V_P$ becomes. By using this principle, it is possible to make a so-called field effect transistor having remote cut-off characteristics. The structure shown in FIG. 14 is quite similar to that shown in FIG. 2, but the first source region 20A is formed below only on a part of the source regions 20B but not below all of them. Such a structure is obtained by changing the pattern of the first source region 20A at the step shown in FIG. 10.

While, in the above description, N-channel field effect transistors are disclosed, it should be understood that the present invention is also applicable to P-channel field effect transistors by changing the conductivity type of the different semiconductor regions.

It will be apparent to those skilled in the art that many modifications and variations may be effected without departing from the spirit and scope of the novel concepts of the present invention.

I claim as my invention:

1. A multi-channel junction gated field effect transistor comprising a substrate of semiconductor material of relatively low impurity concentration of a first conductivity type, a mosaic shape semiconductor gate region of the opposite conductivity type formed in said substrate below one major surface thereof, the mosaic shape of said gate region forming a plurality of windows filled with portions of said substrate which provide channels for said field effect transistor, the main body portion of said substrate providing the drain for said field effect transistor, a corresponding relatively thick mosaic shape insulating layer overlying said mosaic shape gate region having a plurality of windows smaller than said windows of said gate region of the same configuration and aligned with said windows of said gate region, a first source region heavily doped with impurities the first impurity type completely within said windows of said insulating layer extending down from the outer surface of said insulating layer to a point short of the bottom of said windows of said insulating layer, a second source region extending down from at least one of said first source regions and being less heavily doped than said first source region but more heavily doped than said substrate and of said first impurity type doping, said second source region being partially within a window of said insulating layer and extending down below said window of said insulating layer partially into a channel.

2. A multi-channel junction gated field effect transistor according to claim 1, in which said source, channel and drain regions are silicon.

3. A multi-channel junction gated field effect transistor according to claim 1, in which said drain regions are N-type silicon having impurity doping of $10^{14}$ to $10^{15}$ atoms/cm$^3$, said first source regions are N-type silicon having impurity doping of $5 \times 10^{19}$ atoms/cm$^3$ and said second source regions are N-type silicon having impurity doping of $10^{16}$ to $10^{18}$ atoms/cm$^3$.

4. A multi-channel junction gated field effect transistor according to claim 1, in which said insulating layer is a three part sandwich composed of silicon dioxide, silicon nitride and silicon dioxide.

5. A multi-channel junction gated field effect transistor according to claim 1, in which said second source regions correspond in number to said first source regions.

6. A multi-channel junction gated field effect transistor according to claim 1, in which said second source regions extend down from less than half of the first source regions.

7. A junction gated field effect transistor having a plurality of channels, comprising:
 a. a drain region of a first conductivity type of semiconductor material common to said plurality of channels;
 b. a mesh-like gate region formed on said drain region of the second conductivity type, forming a rectifying P-N junction with said drain region and defining said plural channels,
 c. a plurality of first source regions of first conductivity type formed above said channels,
 d. a plurality of second source regions of the first conductivity type formed on and adjacent to at least a part of said channels,
 e. said first source regions having higher impurity conductivity than said second source regions,
 f. said second source regions having a higher impurity concentration than said channel regions and said drain region,
 g. conductive electrodes for said first source, gate and drain regions, and
 the lower surface of said first source regions lying in a plane above the plane of the upper ends of said gate region, the upper ends of said second source regions being interfaced with the lower ends of said first source regions, and the lower ends of said second source regions extending part way into said channels.

* * * * *